(12) United States Patent
Bachmaier et al.

(10) Patent No.: US 7,728,484 B2
(45) Date of Patent: Jun. 1, 2010

(54) HYBRID CONTROL CIRCUIT

(75) Inventors: Georg Bachmaier, München (DE); Bernhard Gottlieb, München (DE); Andreas Kappel, Brunnthal (DE); Tim Schwebel, München (DE); Christian Tump, München (DE); Carsten Wallenhauer, Schwarzheide (DE)

(73) Assignee: Siemens Aktiengesellschaft, Munich (DE)

( * ) Notice: Subject to any disclaimer, the term of this patent is extended or adjusted under 35 U.S.C. 154(b) by 612 days.

(21) Appl. No.: 11/718,074

(22) PCT Filed: Oct. 18, 2005

(86) PCT No.: PCT/EP2005/055341

§ 371 (c)(1),
(2), (4) Date: Apr. 26, 2007

(87) PCT Pub. No.: WO2006/047519

PCT Pub. Date: May 4, 2006

(65) Prior Publication Data

US 2009/0146528 A1    Jun. 11, 2009

(30) Foreign Application Priority Data

Oct. 27, 2004    (DE) .................. 10 2004 052 248

(51) Int. Cl.
*H01L 41/09* (2006.01)
(52) U.S. Cl. ................................. 310/317; 310/316.01
(58) Field of Classification Search ............ 310/316.01, 310/317
See application file for complete search history.

(56) References Cited

U.S. PATENT DOCUMENTS

| 4,410,951 | A | 10/1983 | Nakamura et al. .......... 364/559 |
| 5,264,752 | A | 11/1993 | Savicki ....................... 310/316 |
| 5,714,831 | A * | 2/1998 | Walker et al. .......... 310/316.01 |
| 5,975,057 | A | 11/1999 | Repplinger et al. ......... 123/490 |
| 6,617,754 | B1 | 9/2003 | Knauss .................. 310/316.02 |
| 7,061,157 | B2 | 6/2006 | Battaglin et al. ............. 310/317 |
| 2002/0191424 | A1 | 12/2002 | Heinke ....................... 363/41 |
| 2005/0235966 | A1 | 10/2005 | Lixl et al. .................... 123/490 |
| 2006/0208615 | A1* | 9/2006 | Kasuga et al. ............... 310/317 |

FOREIGN PATENT DOCUMENTS

| DE | 19714607 A1 | 4/1997 |
| DE | 19825210    | 6/1998 |
| DE | 19944249 A1 | 9/1999 |
| DE | 19963154 A1 | 12/1999 |
| DE | 10248214 A1 | 5/2004 |
| WO | 0225747 A2  | 3/2002 |

OTHER PUBLICATIONS

International Search Report with Written Opinion PCT/EP2005/055341, 13 pages, Mailed on Dec. 19, 2005
Written Opinion of the International Searching Authority (Supplementary Sheet) PCT/EP2005/055341, 3 pages.

* cited by examiner

*Primary Examiner*—Thomas M Dougherty
(74) *Attorney, Agent, or Firm*—King & Spalding L.L.P.

(57) ABSTRACT

A device for controlling a capacitive charge, in particular a piezoelectric actuator (2) has a signal generator (6) which is used to control a first end step (1) which is used to produce a discrete signal on the capacitive charge. Device has a second end step (3, 4) which is used to generate a continuous signal on the capacitive charge. A counter-coupling of a deviation of an actual discrete signal is produced by a continuous signal required on the capacitive charge.

20 Claims, 3 Drawing Sheets

HYBRID CONTROL CIRCUIT

CROSS-REFERENCE TO RELATED APPLICATIONS

This application is a U.S. national stage application of International Application No. PCT/EP2005/055341 filed Oct. 18, 2005, which designates the United States of America, and claims priority to German application number 10 2004 052 248.0 filed Oct. 27, 2004, the contents of which are hereby incorporated by reference in their entirety.

TECHNICAL FIELD

The present invention relates to a device for controlling a capacitive load, especially a piezoelectric actuator, featuring a signal generator for controlling a first end stage or a device to produce a discrete signal at the capacitive load.

BACKGROUND

To enable piezoelectric actuators to be used in applications of automotive technology, building technology and automation technology controllers are needed which can generate voltage-time functions with steep edges and high final voltages at capacitive loads. To achieve a high efficiency switching end stages are used to control these actuators. The discontinuous supply of energy however results in a high level of harmonics and deviation of the actuator deflection from its setpoint function. The advantages of a high level of efficiency, lower rise times and higher final voltages are set against a greater harmonic proportion and deviation from the required value. In particular, when the method is used to control the actuators of a piezo motor, a high proportion of harmonics produces higher noise levels. A potential advantage of the piezoelectric drive, the silent idling, thus remains unused.

Control deviations and harmonics which are caused by discrete energy packets from switched end stages can be reduced by adapting the end stages to the piezo-electric actuators and to the time functions to be achieved.

Limits are imposed on this reduction however by the dynamic range of the circuits and components used, as well as by the effort involved in circuit construction. Thus "charge packets" generated by a switching end step can only be scaled within limits. An end stage with small rise times does not create charge packets of the given small size. A predetermined required value is thus not achieved without a deviation in regulation. Harmonics, created by the clocked operation and the high distortion factor of the generated control function resulting from the control deviations can in fact be attenuated by filtering. However, especially if useful and harmonic frequencies lie close together in the frequency band or if high noise levels are to be attenuated, the outlay involved is extraordinarily high and the efficiency is reduced.

SUMMARY

A device can control capacitive loads in such a way that deviations of the signal size at the capacitive load occurring in respect of a predetermined function or deviations of the actuator deflection and a harmonic level are effectively reduced by comparison with conventional control circuits. According to an embodiment, such a device for controlling a capacitive load may comprise a signal generator for controlling a first end stage for producing a discrete signal at the capacitive load, a second end stage for creating a continuous signal at the capacitive load, and a comparison device for controlling the second end stage, wherein the comparison device compares a required continuous signal of the signal generator with an actual discrete signal at the capacitive load.

BRIEF DESCRIPTION OF THE DRAWINGS

The present invention will be explained in greater detail below using exemplary embodiments illustrated in conjunction with the figures. The figures show.

DETAILED DESCRIPTION

Figure 1:
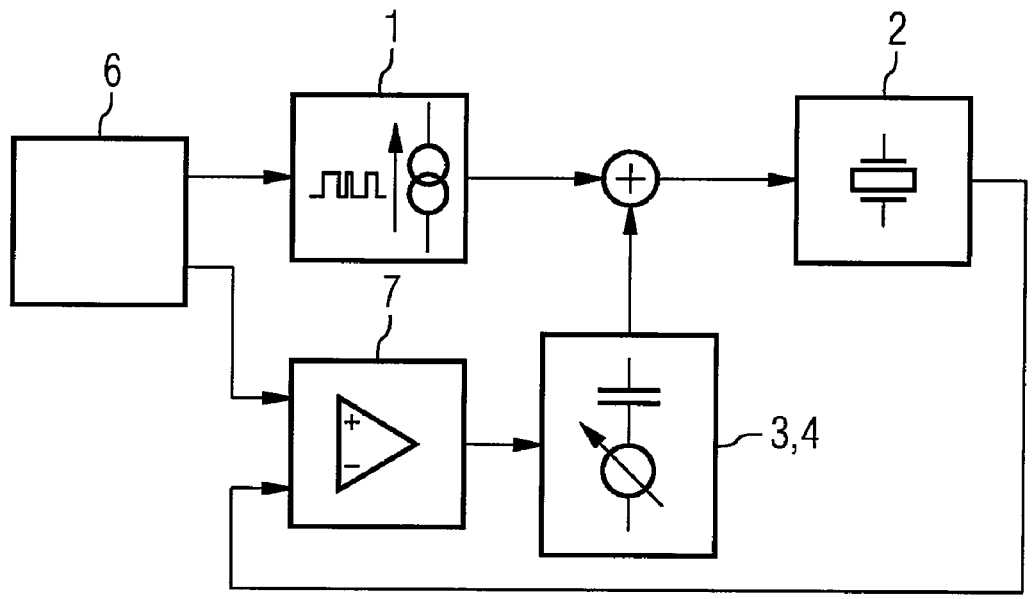
FIG. 1 shows a schematic overall layout to illustrate the principle according to an embodiment.

Using a continuous signal corresponding to a setpoint function, a signal generator generates a discrete signal at the capacitive load at a first end stage or device. By means of a second end stage or device, a continuous signal is generated at the capacitive load depending on a setpoint function of the signal generator and an actual discrete signal at the capacitive load. This means that there is a counter coupling of a deviation of an actual discrete signal from a required continuous signal at the capacitive load. The deviation is detected using a comparison device controlled by the second end stage or device. Static signals in particular are signals with continuous times and values. Discrete signals can be discrete in time or value.

A precise and low-harmonic control of a piezoelectric actuator is effected by a combination of a device for creating discrete signals and a device for creating a continuous signal. The discrete signal is especially a time-discrete signal and moreover especially a clock signal, in particular with constant or variable end level and/or variable duration. Especially when piezo-electric actuators are used the clock signals are voltage-time functions with steep edges and high final voltages. The continuous signal is especially a time-continuous signal. Because of the counter-coupling of a deviation of the actual discrete signal from a setpoint function by means of the continuous signal generated by the second signal generator, distortion factor and harmonic level can be effectively reduced.

In accordance with an advantageous embodiment the signal generator, for control of the first and the second end stage, creates at least one setpoint function, especially a continuous signal.

The comparison device can additionally feature an amplifier, especially for amplification of the difference between the required continuous signal of the signal generator and the actual discrete signal at the capacitive load. Using a comparison device and possibly an amplifier, the actual value of the discrete signal can be compared at the capacitive load with the required value corresponding to a setpoint function. The required value is supplied by the signal generator of the comparison device. After the control signal has been amplified if necessary, the second end stage is controlled in accordance with the result of the comparison. An operational amplifier can be preferred as a suitable comparison device and/or amplifier.

In accordance with an advantageous embodiment the first end stage is provided as a regulated clocked end stage. The first end stage can also be embodied unregulated.

In accordance with a further advantageous embodiment the second end stage with a comparison device can provide a fast controller with corresponding time constants.

Furthermore it is especially advantageous for a measured value recorder to be provided at the capacitive load for detection of the actual value of the signal variable to be used for regulation. The measured value recorder can for example detect voltage, current, charge or energy or power. To this end the measured value recorder is especially electrically connected in series or parallel to the capacitive load. Measured values can also be detected using a non-contact method.

In accordance with advantageous embodiments, the signal generator can directly or indirectly provide a charge, a voltage or general energy at the capacitive load via a corresponding end stage.

It is further advantageous for the second end stage to have a variable voltage source and a capacitor, electrically connected to each other in series or in parallel.

To compensate for outside effects which can result in departure from the regulation range of the second end stage, a compensation element is advantageously electrically connected to the capacitive load or to the capacitor.

It is especially advantageous for the compensation element to be a resistor or a switch electrically connected in parallel to the capacitive load or the capacitor.

FIG. 1 shows a schematic diagram of the overall layout for actuator control according to an embodiment. The layout consists of a signal generator 6, a first end stage 1 (charge generator), an analog regulator made up of components 7, 3, 4 and a load 2.

The signal generator 6 creates the setpoint function which is coarsely simulated by the first end stage 1. A measured value recorder (not shown) on the actuator 2 determines the actual value to which regulation is to be undertaken. These values can for example be voltage, charge or energy. The actual value is fed to the comparison device/amplifier 7 which compares the signal to a setpoint value generated by the signal generator 6 and creates a control variable. The variable voltage source 3 is controlled with this value, whereby a charge is moved from the capacitor 4 to the actuator 2. This corrects the error which has occurred.

Figure 2:
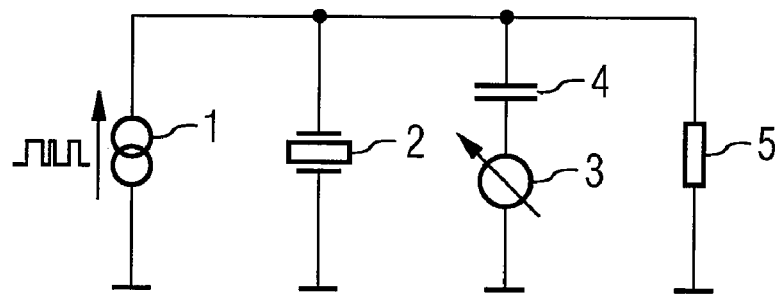
FIG. 2 shows a first exemplary embodiment of a device.

The first exemplary embodiment shown in FIG. 2 effectively solves the technical problems produced with conventional devices. The disadvantages of the clocked end stage are likewise compensated for through combination of a clocked end stage and an end stage with time-continuous output signal. Regulation deviations and harmonics are compensated for by the time-continuous controlling over a large bandwidth.

Likewise, by the circuit depicted in FIG. 2, the two concepts are merged by utilizing the respective advantages. The clocked end stage 1 in this case creates the basic time function of the charge, energy, power, current or voltage at a piezoelectric actuator 2 specified by the signal generator 6. FIG. 2 shows a charge generator 1 as an exemplary embodiment for a clocked end stage. Through a second end stage or a second signal generator, consisting of a branch with a variable voltage source 3 and a capacitor 4, small amounts of charge are taken from or fed to the piezoelectric actuator 2. The variable voltage source 3 is controlled using a control loop sensitive to piezo charge, energy or voltage. Since the requirements for the voltage increase and the currents are small by comparison with a clocked end stage, high limit frequencies of the control loop can be reached. This means that the continuous regulator is able to compensate for harmonics and deviations from the required value over a large bandwidth.

Figure 3:
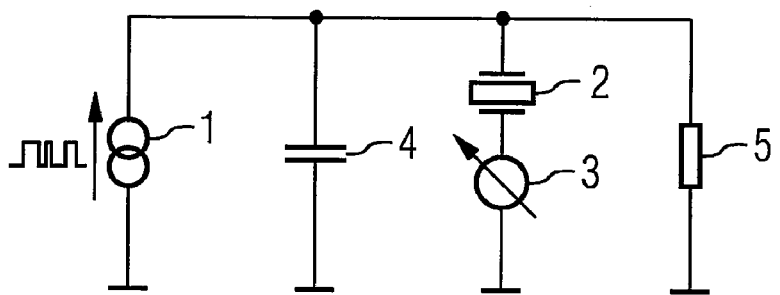
FIG. 3 shows a second exemplary embodiment of a device.

In accordance with a second exemplary embodiment depicted in FIG. 3, a variable voltage source 3 is arranged electrically in parallel to an actuator 2. Actuator 2 and variable voltage source 3 are likewise connected electrically in parallel to a capacitor or to a capacitance 4. A device in accordance with FIG. 3 functions in a comparable manner to the device depicted in FIG. 2, however, by contrast with FIG. 2, the reference potential of the actuator 2 is moved. The capacitance 4 accepts the charge moved from it.

An element 5 in FIGS. 2 and 3 is used to compensate for outside effects which can lead to departures from the range of regulation of the continuous regulator or of the second signal generator. In the simplest case element 5 is an electrical resistor. If the actuator 2 is controlled cyclically, the element 5 can be embodied as a switch which discharges the capacitances 2 and 4 at each zero crossing of the setpoint function. In this case the voltage source 3 is also regulated to zero at zero crossing.

The effective principle according to an embodiment has been verified with the aid of simulations and on the basis of a test setup. The simulation is documented by FIG. 4, FIG. 5 and FIG. 6.

Figure 4:
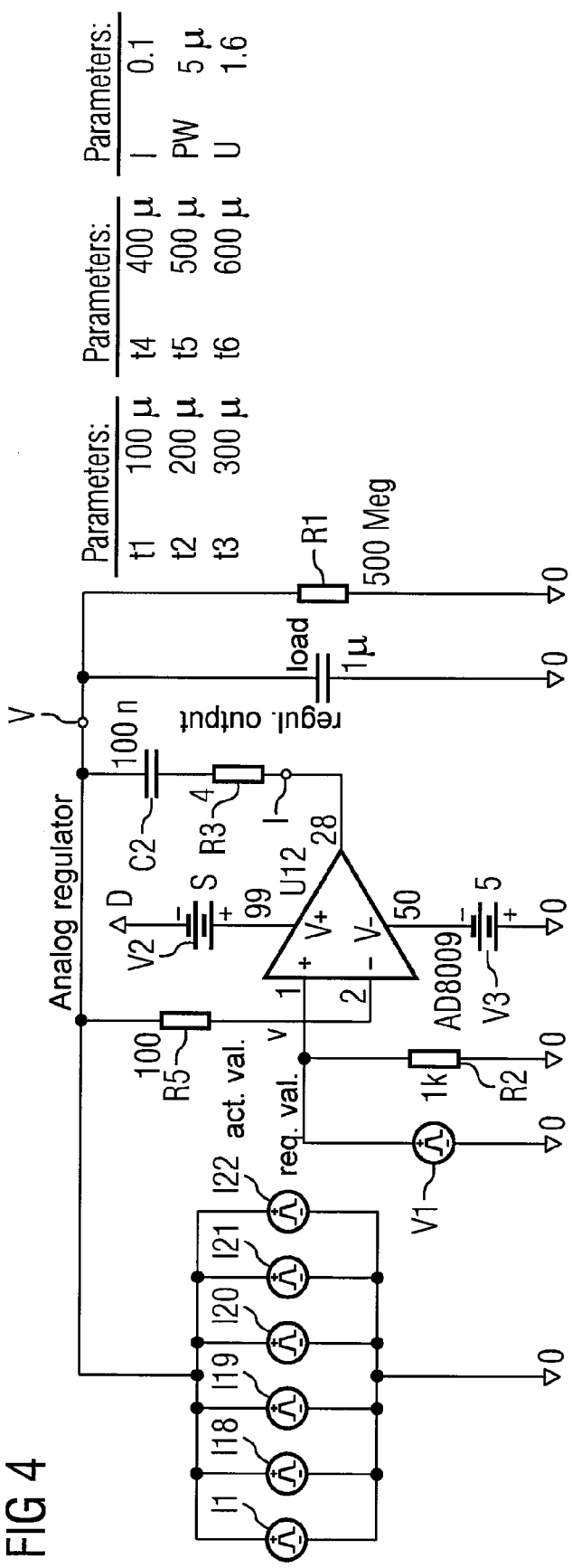
FIG. 4 shows a simulation circuit with a charge generator and a continuous regulator.

FIG. 4 shows the simulation circuit for a hybrid end stage with a charge generator (pulsed current source) and a continuous (analog) controller, essentially consisting of a fast operational amplifier.

Figure 5:
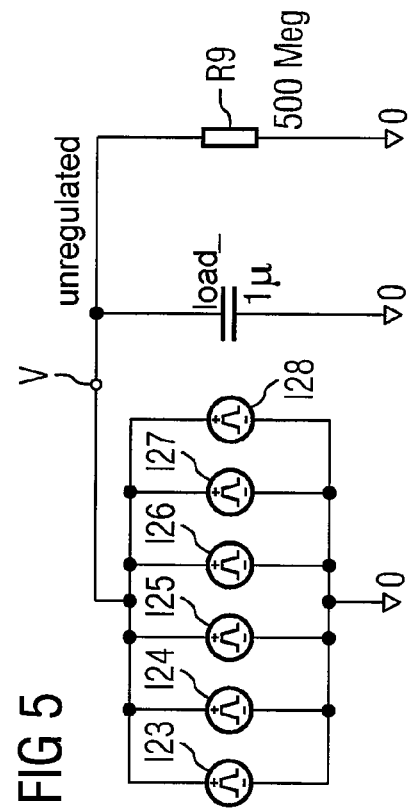
FIG. 5 shows a simulation circuit without a continuous regulator.
Figure 6:
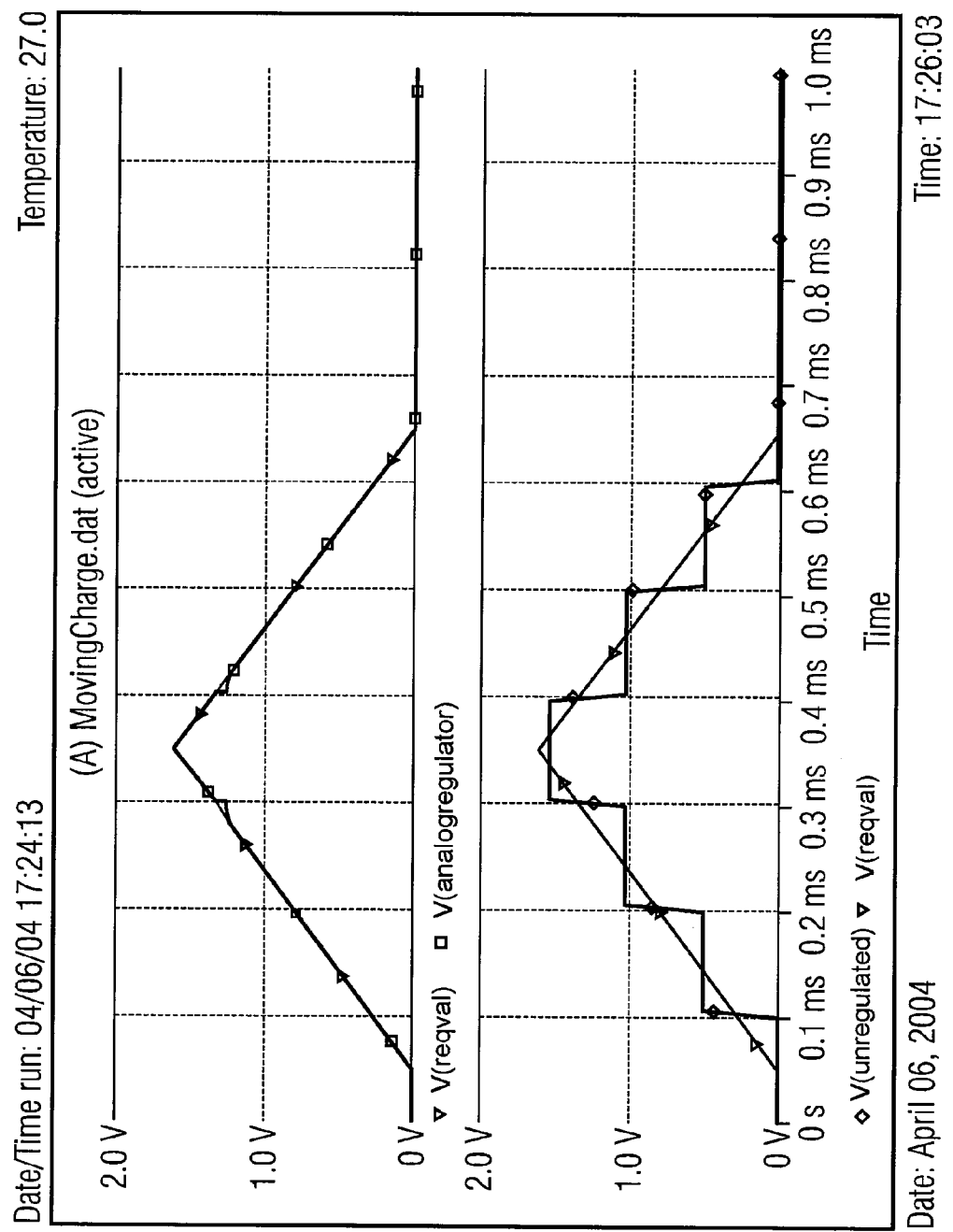
FIG. 6 shows voltage-time functions of a circuit depicted in FIG. 4 (regulated) and FIG. 5 (unregulated).

The circuit depicted in FIG. 5, which is provided without a continuous controller, serves as a comparison to FIG. 4. This circuit creates the unregulated voltage-time function V(unregulated) shown in FIG. 6 (see lower timing diagram). The jumps caused by the voltage generator are clearly visible here. The time function of the required value V(reqval), which is a triangular function, is shown in the same diagram.

By using the regulated circuit according to FIG. 4 the deviations of voltage over the load from the required voltage are effectively reduced. The voltage-time function V (analog regulator) confirms the effect by the small deviations from the required function (see FIG. 6; upper timing diagram).

In practice the jumps created by the clocked end stage are smaller and the final voltages higher. The coupling-in of the continuous regulator (obtaining the actual value) is then undertaken using a voltage divider. The performance under these conditions could also be confirmed on the basis of a test setup.

What is claimed is:

1. A device for controlling a capacitive load comprising:
    a signal generator for controlling a first end stage for producing a discrete signal at the capacitive load,
    a second end stage for creating a continuous signal at the capacitive load,
    a comparison device for controlling the second end stage, wherein the comparison device compares a required continuous signal of the signal generator with an actual discrete signal at the capacitive load.

2. The device according to claim 1, wherein
    the signal generator, for controlling the first end stage and second end stage, creates at least one setpoint function.

3. The device according to claim 1, wherein
    the comparison device additionally comprises an amplifier.

4. The device according to claim 1, wherein
    the first end stage is provided as a regulated clocked end stage.

5. The device according to claim 1, wherein the second end stage has a time constant and by means of its time constants and the comparison device, provides a fast controller.

6. The device according to claim 1, wherein a measured value recorder is provided at the capacitive load for detection of the actual discrete value of the signal variable to which the signal is to be regulated.

7. The device according to claim 1, wherein the signal generator provides a charge, a voltage or general energy.

8. The device according to claim 1, wherein the second end stage features a variable voltage source and a capacitor.

9. The device according to claim 4, wherein an element to compensate for outside effects is electrically connected to the capacitive load or the capacitor.

10. The device according to claim 9, wherein the element to compensate for outside effects is a resistor or a switch electrically connected in parallel to the capacitive load or the capacitor.

11. A method for using a device comprising:
a signal generator for controlling a first end stage for producing a discrete signal at the capacitive load,
a second end stage for creating a continuous signal at the capacitive load,
a comparison device for controlling the second end stage, wherein the comparison device compares a required continuous signal of the signal generator with the actual discrete signal at the capacitive load, the method comprising the steps of:
controlling a capacitive load with a discrete signal by a signal generator and a first end stage outputting discrete signals,
providing a negative feedback of a deviation of an actual discrete signal from a required continuous signal undertaken by means of a continuous signal of a second end stage.

12. A piezo electric actuator for controlling a capacitive load comprising:
a signal generator coupled with a first end stage outputting a discrete signal,
a second end stage outputting a continuous signal, wherein the capacitive load receives a sum of said discrete signal and said continuous signal,
a comparator having an output coupled with the second end stage and having a first input receiving a required continuous signal of the signal generator and a second input receiving an actual discrete signal at the capacitive load.

13. The device according to claim 12, wherein the signal generator generates a continuous signal as a setpoint function.

14. The device according to claim 12, wherein the comparison device comprises an amplifier.

15. The device according to claim 12, wherein the first end stage is provided as a regulated clocked end stage.

16. The device according to claim 12, wherein the second end stage has a time constant and provides a fast controller by means of its time constants and the comparison device.

17. The device according to claim 12, wherein a measured value recorder is provided at the capacitive load for detection of the actual discrete value of the signal variable to which the signal is to be regulated.

18. The device according to claim 12, wherein the second end stage comprises a variable voltage source and a capacitor.

19. The device according to claim 15, wherein an element to compensate for outside effects is electrically connected to the capacitive load or the capacitor.

20. The device according to claim 19, wherein the element to compensate for outside effects is a resistor or a switch electrically connected in parallel to the capacitive load or the capacitor.

* * * * *